US008590548B2

(12) United States Patent
Eshima

(10) Patent No.: US 8,590,548 B2
(45) Date of Patent: Nov. 26, 2013

(54) LIQUID PROCESSING APPARATUS FOR SUBSTRATE, METHOD FOR GENERATING PROCESSING LIQUID, AND COMPUTER READABLE RECORDING MEDIUM STORING PROGRAM FOR GENERATING PROCESSING LIQUID THEREIN

(75) Inventor: Kazuyoshi Eshima, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 496 days.

(21) Appl. No.: 12/876,590

(22) Filed: Sep. 7, 2010

(65) Prior Publication Data

US 2011/0061683 A1    Mar. 17, 2011

(30) Foreign Application Priority Data

Sep. 11, 2009    (JP) ................. 2009-210898
Jul. 14, 2010    (JP) ................. 2010-159436

(51) Int. Cl.
*H01L 21/304*    (2006.01)
(52) U.S. Cl.
USPC ........................................... 134/84
(58) Field of Classification Search
USPC ........................................... 134/84
See application file for complete search history.

(56) References Cited

U.S. PATENT DOCUMENTS 6,158,721 A * 12/2000 Katou et al. .................... 261/26

FOREIGN PATENT DOCUMENTS

| JP | 2000-159504 | * | 6/2000 | ........ C01B 5/00 |
| JP | 2000-159504 A | | 6/2000 | |

* cited by examiner

*Primary Examiner* — Michael Barr
*Assistant Examiner* — Jason Riggleman
(74) *Attorney, Agent, or Firm* — Abelman, Frayne & Schwab

(57) ABSTRACT

Provided is a liquid processing apparatus for a substrate, including a plurality of substrate processing units configured to process the substrate using a processing liquid, a processing liquid generating unit configured to dissolve a gas into a solvent to generate the processing liquid with a predetermined concentration where the processing liquid being supplied to one of the plurality of substrate processing units or being supplied to two or more of the plurality of substrate processing units simultaneously, and a control unit configured to control the plurality of substrate processing units. Also provided are a method for generating the processing liquid and a recording medium storing a program for generating the processing liquid. The liquid processing apparatus generates a processing liquid having a predetermined concentration regardless of the flow rate of the processing liquid used simultaneously.

5 Claims, 4 Drawing Sheets

LIQUID PROCESSING APPARATUS FOR SUBSTRATE, METHOD FOR GENERATING PROCESSING LIQUID, AND COMPUTER READABLE RECORDING MEDIUM STORING PROGRAM FOR GENERATING PROCESSING LIQUID THEREIN

This application is based on and claims priority from Japanese Patent Application No. 2009-210898, filed on Sep. 11, 2009, with the Japanese Patent Office, the disclosure of which is incorporated herein in its entirety by reference.

TECHNICAL FIELD

The present disclosure relates to a substrate liquid processing apparatus (hereinafter, referred to as "liquid processing apparatus") for processing a substrate using a processing liquid with a predetermined concentration, generated by dissolving a gas into a solvent, a method for generating the processing liquid, and a computer readable recording medium having a program for generating the processing liquid therein.

BACKGROUND

Conventionally, upon manufacturing a semiconductor component or a flat panel display, etc, a substrate such as a semiconductor wafer or a liquid crystal substrate is subjected to various processes using a liquid processing apparatus in order to perform a cleaning process or etching process.

In this liquid processing apparatus, a process using a deionized water has been widely performed for a process such as a cleaning of the substrate, but since the deionized water has a high specific resistance value, a static electricity is generated while the substrate is processed with the deionized water, and thus there have been caused such problems that the electrostatic breakdown can be generated at the surface of the substrate by the static electricity or particles can be adhered to the surface of the substrate.

In view of these problems, the liquid processing apparatus is provided with a processing liquid generating unit for generating a processing liquid by dissolving a gas such as carbon dioxide or ammonia gas into the deionized water. As a result, the processing liquid generated by the processing liquid generating unit has a low specific resistance value, and is used to process a wafer.

And, a conventional liquid processing apparatus is provided with a processing liquid generating unit 101 configured as shown in FIG. 5. In processing liquid generating unit 101, a gas dissolving line 103 and a bypass line 104 are connected in parallel to a deionized water source 102 for supplying the deionized water, a gas dissolver 105 is provided in an intermediate part of gas dissolving line 103, and a gas source 106 for supplying a gas such as carbon dioxide or ammonia gas is connected to gas dissolver 105.

The processing liquid generating unit 101 is configured to dissolve the gas into the deionized water flowing through gas dissolving line 103 by gas dissolver 105 and then to mix the deionized water with a deionized water flowing through bypass line 104, and thus to generate a processing liquid having a specific resistance value reduced to a predetermined value. See, for example, Japanese Patent Laid-open No. 2000-159504.

The processing liquid generating unit 101 is configured to dissolve the gas into the deionized water flowing through gas dissolving line 103 by gas dissolver 105 and then to mix the deionized water with a deionized water flowing through bypass line 104, thereby generating a processing liquid which has a predetermined concentration by reducing the specific resistance to a predetermined value.

In this way, the conventional liquid processing apparatus is caused to generate a processing liquid having a predetermined concentration (a predetermined property) regulated by dissolving a gas such as a carbon dioxide into a solvent such as a deionized water and to process a substrate at one of substrate processing units or simultaneously at two or more of the substrate processing units using the processing liquid.

However, it is often the case that since the conventional liquid processing apparatus is configured to process a substrate at one of a plurality of substrate processing units or simultaneously at two or more of the plurality of substrate processing units, the flow rate of the processing liquid used at a time, that is, the flow rate of the processing liquid generated by the processing liquid generating unit is largely fluctuated depending upon the number of the substrate processing units used simultaneously. Especially, there has been a problem that if the flow rate of the processing liquid (the flow rate of processing liquid generated by the substrate processing unit) is reduced, the processing liquid may not be generated with a desired concentration (specific resistance value) by the processing liquid generating unit.

SUMMARY

According to an exemplary embodiment, there is provided a liquid processing apparatus for a substrate. The liquid processing apparatus includes a plurality of substrate processing units configured to process the substrate using a processing liquid, a processing liquid generating unit configured to dissolve a gas into a solvent to generate the processing liquid with a predetermined concentration where the processing liquid being supplied to one of the plurality of substrate processing units or being supplied to two or more of the plurality of substrate processing units simultaneously, and a control unit configured to control the plurality of substrate processing units and the processing liquid generating unit. The processing liquid generating unit includes a solvent supply pipe connected to a solvent source to supply the solvent, a dissolving line configured to dissolve the gas into the solvent supplied from the solvent supply pipe, a bypass line connected in parallel to the dissolving line configured to allow the solvent to flow therethrough and a resistance changing unit configured to change the flow resistance of the bypass line. The control unit controls the resistance changing unit so that the ratio of the flow rate of the solvent flowing through the dissolving line to the flow rate of the solvent flowing through the bypass line becomes to be constant.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
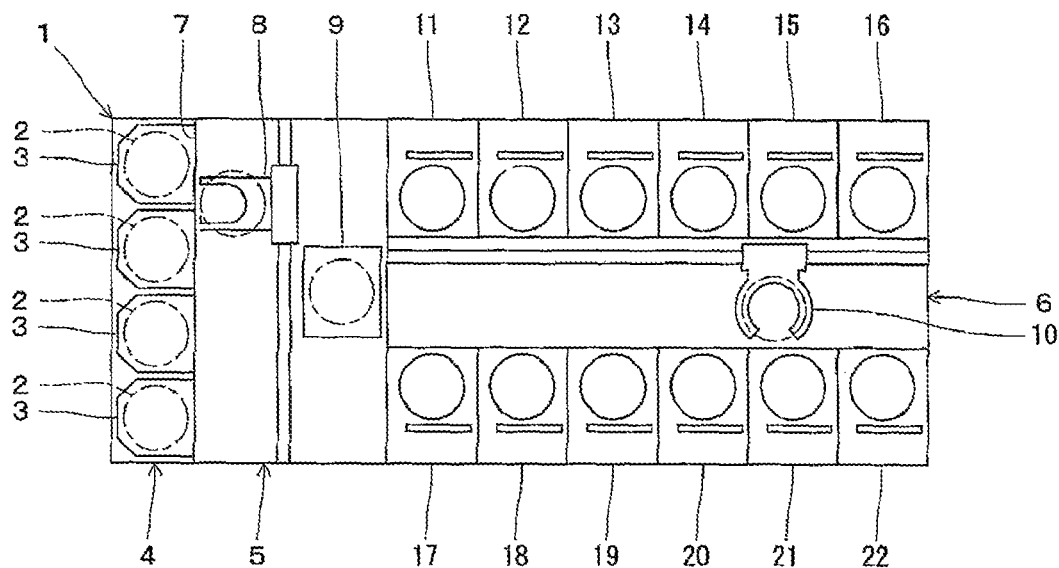
FIG. 1 is a plan view illustrating a liquid processing apparatus for a substrate, according to an embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

According to an aspect of the present disclosure, there is provided a liquid processing apparatus for a substrate. The liquid processing apparatus includes a plurality of substrate processing units configured to process the substrate using a processing liquid, a processing liquid generating unit configured to dissolve a gas into a solvent to generate the processing liquid with a predetermined concentration where the processing liquid being supplied to one of the plurality of substrate processing units or being supplied to two or more of the plurality of substrate processing units simultaneously, and a control unit configured to control the plurality of substrate processing units and the processing liquid generating unit. The processing liquid generating unit includes a solvent supply pipe connected to a solvent source to supply the solvent, a dissolving line configured to dissolve the gas into the solvent supplied from the solvent supply pipe, a bypass line connected in parallel to the dissolving line configured to allow the solvent to flow therethrough and a resistance changing unit configured to change the flow resistance of the bypass line. The control unit controls the resistance changing unit so that the ratio of the flow rate of the solvent flowing through the dissolving line to the flow rate of the solvent flowing through the bypass line becomes to be constant.

In addition, the resistance changing unit may be constituted by connecting a plurality of bypass line constituting pipes in parallel, and the control unit may control the resistance changing means so that the flow resistance of the bypass line is changed by changing the one or more bypass line constituting pipes for allowing the solvent to flow therethrough, depending upon the flow rate of the generated processing liquid.

Also, the flow resistance of each of the plurality of bypass line constituting pipes may be different from each other.

Further, at least one of the plurality of bypass line constituting pipes may be provided with a flow regulator.

Further, the resistance changing unit may be a flow regulator provided in the bypass line.

Also, the dissolving line may be configured to dissolve the gas into the solvent so as to allow the processing liquid to be saturated.

According to another aspect of the present disclosure, there is provided a method for generating a processing liquid for a substrate. The method includes dividing a solvent supplied from a solvent source to flow through a dissolving line configured to dissolve the a gas into the solvent by a gas dissolver and through a bypass line connected to the dissolving line in parallel, and changing a flow resistance of the bypass line so that the ratio of the flow rate of the solvent flowing through the dissolving line to the flow rate of the solvent flowing through the bypass line becomes to be constant. The processing liquid is provided with a predetermined concentration by dissolving the gas into the solvent, and the substrate is processed at one of a plurality of substrate processing units or at two or more of a plurality of substrate processing units simultaneously by the processing liquid.

Also, the method may further include constituting the bypass line by connecting a plurality of bypass line constituting pipes each having a different flow resistance, in parallel, and flowing the solvent to one or more of the plurality of bypass line constituting pipes, depending upon the flow rate of the generated processing liquid.

Also, the method may further include dissolving the gas into the solvent at the dissolving line to cause the processing liquid to be saturated.

In addition, a carbon dioxide may be used as the gas.

According to yet another aspect of the present disclosure, there is provided a recording medium storing a program for generating a processing liquid. The program, when executed, causes a computer to perform steps of dividing a solvent supplied from a solvent source to flow through a dissolving line configured to dissolve the gas into the solvent by a gas dissolver and through a bypass line connected to the dissolving line in parallel, and changing a flow resistance of the bypass line so that the ratio of the flow rate of the solvent flowing through the dissolving line to the flow rate of the solvent flowing through the bypass line becomes to be constant. The processing liquid is provided with a predetermined concentration by dissolving the gas into the solvent, and the substrate is processed at one of a plurality of substrate processing units or at two or more of a plurality of substrate processing units simultaneously by the processing liquid.

Also, the program for generating a process liquid, when executed, further may cause the computer to perform constituting the bypass line by connecting a plurality of bypass line constituting pipes each having a different flow resistance, in parallel, and flowing the solvent to one or more of the plurality of bypass line constituting pipes, depending upon the flow rate of the generated processing liquid.

According to the present disclosure, since the flow resistance changing unit for changing the flow resistance is controlled so that the ratio of the flow rate of the solvent flowing through the dissolving line to the flow rate of the solvent flowing through the bypass line becomes to be constant, regardless of an amount of the processing liquid supplied to the substrate processing unit, it is possible to generate and supply the processing liquid always having a predetermined concentration to the substrate processing unit, and thus to process the substrate uniformly at the plurality of substrate processing units.

Especially, it is possible to generate the processing liquid having a predetermined concentration, even if the flow rate of the generated processing liquid is small.

Hereinafter, an exemplary embodiment as a non-limiting example of the present disclosure will be described with reference to appended drawings. In all of the appended drawings, the same or corresponding members (or components) are designated with the same or corresponding reference numerals to omit repeated descriptions.

From now, a liquid processing apparatus according to the present disclosure, a method for generating a processing liquid used in the liquid processing apparatus and a recording medium storing a program for causing a computer to control the liquid processing apparatus to generate the processing liquid will be explained in detail by referring to FIGS. 1 to 4.

As shown in FIG. 1, a liquid processing apparatus 1 is provided at its front end part with a substrate carry in/out table 4 for incorporating a plurality of (e.g., 25) substrates 2 (herein, semiconductor wafers) and carrying in/out the substrates to and from a carrier 3, and a substrate transfer chamber 5 is provided at a rear end part of substrate carry in/out table 4 for transferring substrate 2 contained in carrier 3 one by one, and a single substrate processing chamber 6 is provided at the rear part of substrate transfer chamber 5 for performing various processes such as a cleaning or a drying of the substrate 2.

Substrate carry in/out table 4 is configured to allow four carriers 3 to be disposed in a right and left spacing while being pressed against a front wall 7 of substrate transfer chamber 5.

Substrate transfer chamber 5 is provided at its interior with a substrate transfer device 8 and a substrate carrying table 9, and is configured to transfer substrate 2 one by one between any one of carriers 3 disposed on substrate carry in/out table 4 and substrate carrying table 9 using substrate transfer device 8.

Substrate processing chamber 6 contains a substrate transfer device 10 in its center portion, contains the first to the sixth substrate processing units 11~16 arranged in a front and rear directions at a left side of substrate transfer device 10, and contains the seventh to the twelfth substrate processing units 17~22 arranged in a front and rear direction at a right side of substrate transfer device 10.

And, substrate processing chamber 6 is configured to transfer substrate 2 one by one between substrate carrying table 9 of substrate transfer chamber 5 and each of substrate processing units 11~22 using substrate transfer device 10, and to process substrate 2 one by one using each of substrate processing units 11~22. Herein, while a single substrate 2 is processed at each of substrate processing units 11~22, substrate processing chamber 6 (liquid processing apparatus 1) may be configured to process substrates 2 simultaneously at two or more of substrate processing units 11~22 (e.g., 12 units), by driving two or more of substrate processing units 11~22 simultaneously.

Figure 2:
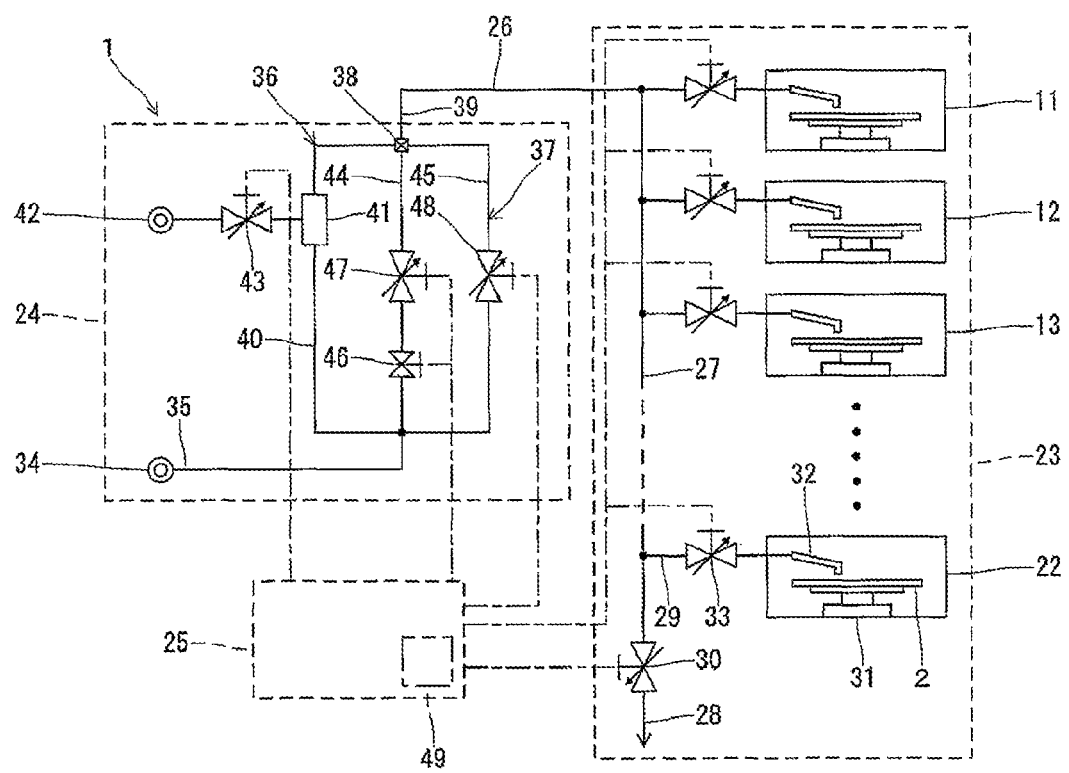
FIG. 2 is a block diagram of FIG. 1.

As shown in FIG. 2, substrate processing chamber 6 contains a substrate processing mechanism 23 constituted by the first through the twelfth substrate processing units 11~22, a processing liquid generating unit 24 for generating a processing liquid supplied to substrate processing mechanism 23, and a control unit 25 for controlling these substrate processing mechanism 23 and processing liquid generating unit 24. Also, control unit 25 is configured to control the entire liquid processing apparatus 1 including substrate transfer devices 8, 10. And, with respect to the configuration of processing liquid generating unit 24, only the configuration is shown for supplying the processing liquid in which a specific resistance value is reduced by dissolving a gas into a deionized water, to substrate processing mechanism 23. However, the configuration for supplying a chemical liquid to substrate processing mechanism 23 is not shown.

In substrate processing mechanism 23, a common supply pipe 27 is connected to a front end part of a connecting pipe 26 connected to processing liquid generating unit 24 and a discharge pipe 28 is connected to a front end part of common supply pipe 27.

Herein, common supply pipe 27 is branched and connected to a branched pipe 29 of each of substrate processing units 11~22, and is configured to supply the processing liquid supplied from processing liquid generating unit 24 through branched pipe 29 to each of substrate processing units 11~22.

Further, discharge pipe 28 is connected to the front end part of common supply pipe 27 through a flow regulator 30, and is configured to discharge the processing liquid remained in the common supply pipe without being used at substrate processing units 11~22, among the processing liquid supplied from processing liquid generating unit 24. Also, the flow rate of the discharged processing liquid is regulated by controlling flow regulator 30 by control unit 25.

In addition, each of substrate processing units 11~22 is provided with a nozzle 32 for discharging the processing liquid toward the surface of substrate 2, at a position over a substrate support device 31 for rotatably supporting substrate 2, and common supply pipe 27 is connected to each nozzle 32 through branched pipe 29 and flow regulator 33. The flow rate of processing liquid discharged from each of nozzles 32 (a flow rate of processing liquid used at each of substrate processing units 11~22) is regulated by controlling each flow regulator 32 by control unit 25. Accordingly, the sum of flow rates regulated by each flow regulator 33 becomes the flow rate of the processing liquid used simultaneously and thus becomes the flow rate of the processing liquid supplied from processing liquid generating unit 24 to substrate processing mechanism 23.

In processing liquid generating unit 24, a solvent source 34 is connected to a solvent supply pipe 35 for supplying a solvent, solvent supply pipe 35 is connected to a mixer 38 through a dissolving line 36 and a bypass line 37 arranged in parallel at the front end part thereof, mixer 38 is connected to a processing liquid supply pipe 39, and processing liquid supply pipe 39 is connected to common supply pipe 27 of substrate processing mechanism 23 through connecting pipe 26. Also, the liquid such as a deionized water or a hydrogen peroxide can be used as the solvent. Herein, the deionized water is used as the solvent.

In dissolving line 36, a gas dissolver 41 is provided at the intermediate part of a branched pipe 40 branched from solvent supply pipe 35, and a gas source 42 is connected to gas dissolver 41 through a flow regulator 43 for supplying the gas to the gas dissolver. Also, a gas such as carbon dioxide, ammonia gas, oxygen gas or hydrogen gas capable of being dissolved well into a liquid solvent may be used as the gas. Herein, the carbon dioxide used as the gas is dissolved into the deionized water used as the solvent so as to reduce the specific resistance value of the deionized water.

And, dissolving line 36 is configured to dissolve the gas supplied from gas source 42 into the solvent flowing through branched pipe 40 by gas dissolver 41. Also, the flow rate of the dissolved gas is regulated by controlling flow regulator 43 by control unit 25, and, in this embodiment, flow regulator 43 is configured to supply the maximum flow rate of the gas capable of being dissolved into the solvent to gas dissolver 41 thereby allowing the processing liquid to be saturated, and gas dissolver 41 is configured to dissolve the gas into the solvent for allowing the processing liquid to be saturated.

Further, in bypass line 37, a bypass line constituting pipe 44 of large flow rate (hereinafter, referred as "large bypass line constituting pipe") and a bypass line constituting pipe 45 of small flow rate (hereinafter, referred as "small bypass line constituting pipe") branched from solvent supply pipe 35 are connected to dissolving line 36 in parallel, an open/close valve 46 and a flow regulator 47 are provided at the intermediate part of large bypass line constituting pipe 44, and a flow regulator 48 is provided at an intermediate part of small bypass line constituting pipe 45. Herein, flow regulator 47 provided in large bypass line constituting pipe 44 has a capacity capable of regulating a larger flow rate of the solvent than that of flow regulator 48 provided in small bypass line constituting pipe 45, and the flow regulating range of each flow regulator 47, 48 is different from each other.

In bypass line 37, the diameter of large bypass line constituting pipe 44 is larger than that of small bypass line constituting pipe 45 so that the flow resistance of the large constituting pipe becomes to be smaller. In this manner, bypass line 37 is constituted by bypass line constituting pipes 44, 45 each having a flow resistance different from each other. Also, the flow rate of each bypass line constituting pipe 44, 45 is regulated by controlling flow regulator 47, 48 by control unit 25.

Further, in bypass line 37, when open/close valve 46 is at an open state, the solvent is allowed to flow simultaneously through both bypass line constituting pipes 44, 45 to cause the entire flow resistance of bypass line 37 to be reduced, whereas when open/close valve 46 is at a closed state, the solvent is allowed to flow only through small bypass line constituting pipe 45 to cause the entire flow resistance of bypass line 37 to be increased. Also, the open and close operation of open/close valve 46 is controlled by control unit 25.

Accordingly, open/close valve 46 serves as a passage change unit capable of changing internal passages constituting bypass line 37 by an open and close operation, and also serves as a flow resistance change unit capable of changing the entire flow resistance of bypass line 37 by switching the passage. Further, although, in this embodiment, open/close valve 46 serving as the passage change unit is provided only at large bypass line constituting pipe 44, the passage change unit may be provided at both bypass line constituting pipes 44, 45. Also, so far as the passage change unit can change one or both bypass line constituting pipes 44, 45 through which the solvent flows, the passage change unit may be configured to cause the solvent to flow simultaneously through both bypass line constituting pipes 44, 45 or to cause the solvent to flow through any one of bypass line constituting pipes 44, 45.

Flow regulators 47, 48 are configured to divide the solvent so that the ratio of the flow rate of the solvent flowing through the dissolving line 36 to the flow rate of the solvent flowing through the bypass line 37 becomes to be constant, regardless of the total flow rate of the solvent supplied from solvent source 35 to dissolving line 36 and bypass line 37, and, may be, for example, a flow controller, an orifice or a needle valve.

Liquid processing apparatus 1 is configured as explained above, and is configured to cause processing liquid generating unit 24 to generate a processing liquid according to a processing liquid generating program stored on a recording medium 49 readable by control unit 25 (computer), and to cause substrate processing mechanism 23 to process substrate 2 according to a substrate processing program recorded on recording medium 49 readable by control unit 25 (computer). Recording medium 49 may be a semiconductor memory type recording medium such as ROM or RAM, or may be a disk type recording medium such as a hard-disk or CD-ROM, so far as the recording medium can store various programs such as the processing liquid generating program or the substrate processing program.

In liquid processing apparatus 1, when substrate 2 is carried into substrate processing units 11~22 by substrate transfer device 10, substrate 2 is normally transferred one by one to each of substrate processing units 11~22. In this way, since the transfer timing of substrate 2 to substrate processing units 11~22 is different from each other, the processing of substrate 2 in substrate processing units 11~22 using the processing liquid does not normally begin all at once but one by one.

Further, liquid processing apparatus 1 is configured to cause processing liquid generating unit 24 to generate the processing liquid used in each substrate processing unit 11~22 according to the processing liquid generating program. In particular, since, in liquid processing apparatus 1, substrate 2 is processed at one or more of substrate processing unit 11~22, processing liquid generating unit 24 generates the processing liquid in a different quantity depending upon the number of substrate processing unit 11~22 used simultaneously, and thus the total flow rate of the solvent supplied from solvent source 35 to dissolving line 36 and bypass line 37 of processing liquid generating unit 24 is also varied.

Further, liquid processing apparatus 1 is caused to control the processing liquid generating program to change the flow resistance of bypass line 37 of processing liquid generating unit 24 depending upon the total flow rate of the solvent supplied from solvent source 35 to dissolving line 36 and bypass line 37. In addition, at this time, liquid processing apparatus 1 is caused to control flow regulators 47, 48 provided in bypass line 37 so as to maintain the ratio of the flow rate of the solvent flowing through the dissolving line 36 to the flow rate of the solvent flowing through the bypass line 37 always to be constant, regardless of the total flow rate of the solvent supplied from solvent source 35 to dissolving line 36 and bypass line 37.

That is, when the total flow rate of the solvent supplied from solvent source 35 to dissolving line 36 and bypass line 37 is not less than a predetermined flow rate (e.g., 20 L/min), the processing liquid generating program is programmed to cause control unit 25 to open open/close valve 46 for flowing the solvent simultaneously through both bypass line constituting pipes 44, 45, thereby reducing the entire flow resistance of bypass line 37. At this time, the processing liquid generating program is programmed to control flow regulators 47, 48 provided in both bypass line constituting pipes 44, 45, respectively, so as to allow the ratio of the flow rate of the solvent flowing through the dissolving line 36 to the flow rate of the solvent flowing through the bypass line 37 always to be a predetermined constant value (e.g., 5%).

In the mean time, when the total flow rate of the solvent supplied from solvent source 35 to dissolving line 36 and bypass line 37 is less than a predetermined flow rate (e.g., 20 L/min), the processing liquid generating program is programmed to cause control unit 25 to close open/close valve 46 for flowing the solvent through only small bypass line constituting pipe 45 of bypass line 37, thereby increasing the entire flow resistance of bypass line 37. At this time, the processing liquid generating program is programmed to control only flow regulator 48 provided in small bypass line constituting pipe 45 so as to allow the ratio of the flow rate of the solvent flowing through the dissolving line 36 to the flow rate of the solvent flowing through the bypass line 37 always to be a predetermined constant value (e.g., 5%).

In processing liquid generating unit 24, gas dissolver 41 is provided in gas dissolving line 36, and thus when the flow resistance becomes to be larger, and especially, when the flow rate of the processing liquid generated at processing liquid generating unit 24 and supplied to substrate processing mechanism 23 is small, there is a risk that the solvent does not flow into gas dissolving line 36. However, according to the processing liquid generating program, the solvent may flow into dissolving line 36 by increasing the entire flow resistance of bypass line 37 when the flow rate of the processing liquid generated at processing liquid generating unit 24 and supplied to substrate processing mechanism 23 is small. As a result, it is possible to supply the processing liquid having a predetermined concentration from processing liquid generating unit 24 to substrate processing mechanism 23, even if the flow rate of the processing liquid is small.

As explained above, since liquid processing apparatus 1 is configure to control the flow rate of the solvent flowing through the bypass line so as to maintain the ratio of the flow rate of the solvent flowing through the dissolving line 36 to the flow rate of the solvent flowing through the bypass line 37 always to be constant, regardless of the supply quantity of the processing liquid supplied to substrate processing units 11~22, it is always possible to generate the processing liquid having the predetermined concentration and to process the substrate uniformly by the processing liquid. Since the flow resistance of bypass line 37 of processing liquid generating unit 24 is caused to be changed depending upon the supply quantity of the processing liquid supplied to substrate processing units 11~22, it is possible to generate the processing liquid having a predetermined specific resistance in a wider flow rate range.

In particular, it is possible to generate the processing liquid having the predetermined concentration (specific resistance value), even if the flow rate of the generated processing liquid is small.

Further, there can be various modified embodiments for the above embodiment. Hereinafter, one example of the modified embodiments will be explained.

Figure 3:
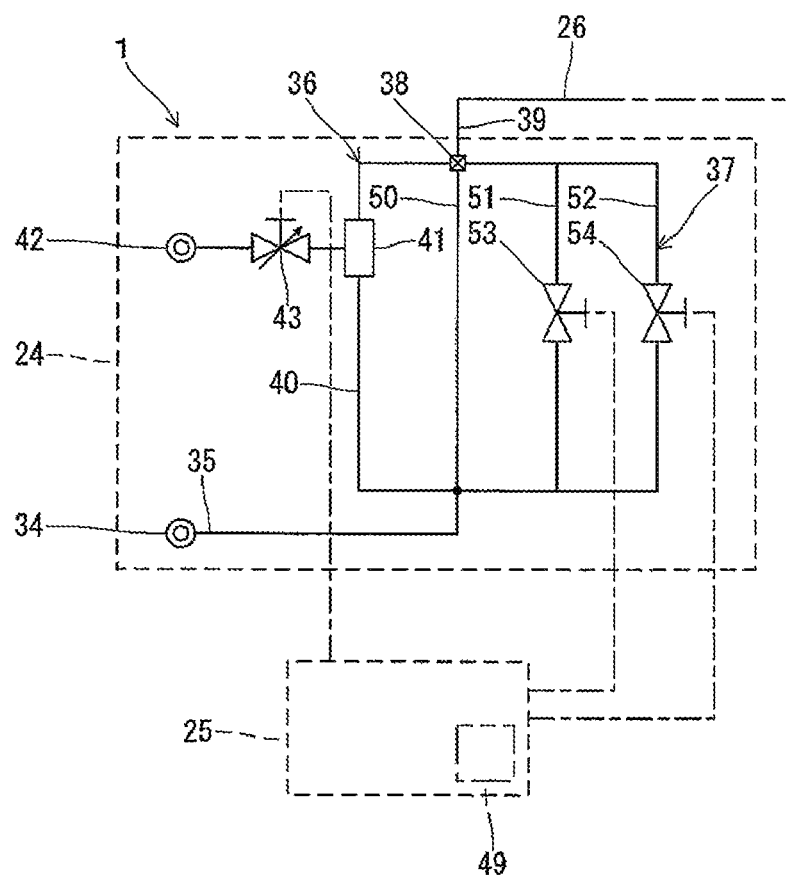
FIG. 3 is a block diagram illustrating a modified example of FIG. 1.

Although, in the above embodiment, bypass line 37 is constituted by two bypass line constituting pipes 44, 45 each having a flow resistance different from each other, the present disclosure is not limited thereto. For example, as shown in FIG. 3, bypass line 37 may be constituted by a plurality of (multiple) bypass line constituting pipes 50, 51, 52 each having a flow resistance different from each other. Herein, the pipe diameter of each of bypass line constituting pipes 50, 51, 52 is different from each other. Also, open/close valves 53, 54 are provided in bypass line constituting pipes 51, 52.

And, the processing liquid generating program is caused to change the number of bypass line constituting pipes 50, 51, 52 for allowing the processing liquid to flow therethrough, depending upon the flow rate of the processing liquid generated at processing liquid generating unit 24 and supplied to substrate processing mechanism 23. Specifically, when the flow rate of the processing liquid generated at processing liquid generating unit 24 and supplied to substrate processing mechanism 23 is not less than, for example, 20 L/min, open/close valves 53, 54 are controlled to an open state for allowing the processing liquid to flow through bypass line constituting pipes 50, 51, 52 simultaneously. However, when the flow rate is not less than 10 L/min and less than 20 L/min, open/close valve 53 is controlled to an open state and open/close valve 54 is controlled to a closed state for allowing the processing liquid to flow through bypass line constituting pipes 50, 51 simultaneously. And when the flow rate is less than 10 L/min, open/close valve 53 is controlled to a closed state for allowing the processing liquid to flow through only bypass line constituting pipe 51. In this way, since the entire flow resistance of bypass line 37 can be changed by switching one or more passages, it is possible to change the flow resistance of bypass line 37 of processing liquid generating unit 24 depending upon the supply quantity of the processing liquid supplied to substrate processing units 11~22.

Flow regulator may be provided in an intermediate part of one or more of a plurality of (multiple) bypass line constituting pipes 50, 51, 52.

Further, it may be possible to change the flow resistance of bypass line 37 by maintaining the flow resistance at bypass line constituting pipes 50, 51, 52 to be identical and by flowing the processing liquid through one or more bypass line constituting pipes 50, 51, 52 depending on the supply quantity of the processing liquid to substrate processing units 11~22.

Figure 4:
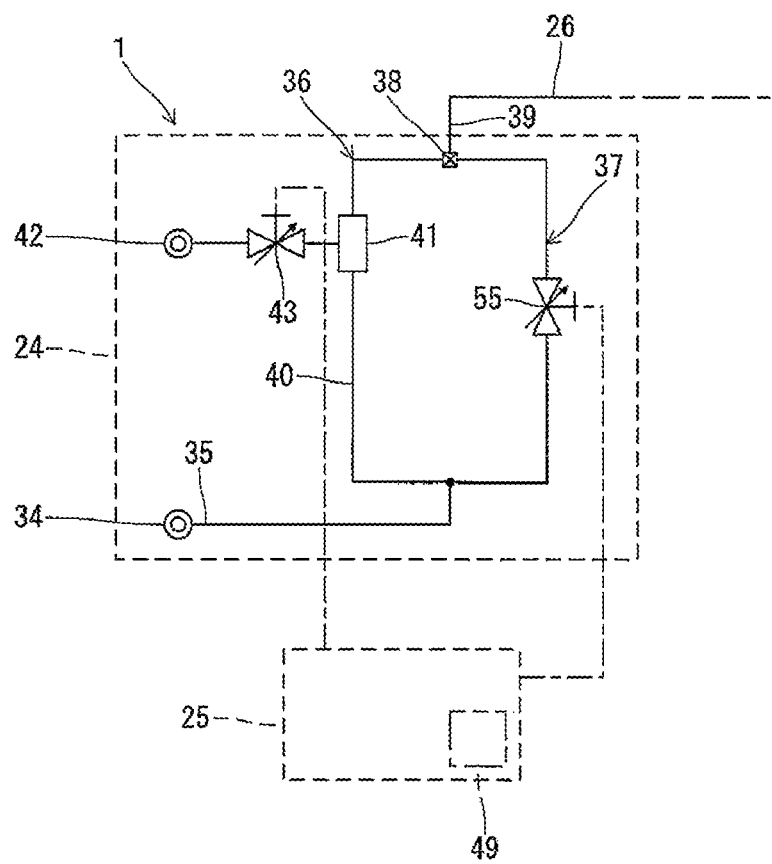
FIG. 4 is a block diagram illustrating a modified example of FIG. 1.
Figure 5:
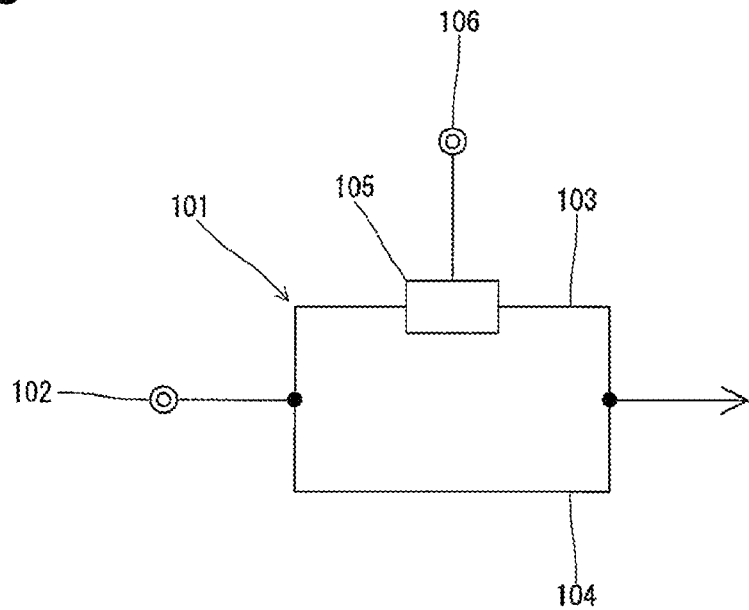
FIG. 5 is an explanatory view illustrating a conventional processing liquid generating unit.

Also, as shown in FIG. 4 for example, it is possible to change the flow resistance by providing flow regulator 55 at bypass line 37.

And, the processing liquid generating program is caused to control flow regulator 55 to an open state by control unit 25 when the total flow rate of the solvent supplied from solvent source 35 to dissolving line 36 and bypass line 37 is not less than, for example, 20 L/min, and to control flow regulator 61 so as to have a predetermined flow resistance by control unit 25 when the total flow rate is less than 20 L/min. Accordingly, it is possible to change the flow resistance of bypass line 37 of processing liquid generating unit 24 depending upon the supply quantity of the processing liquid supplied to substrates processing units 11~22.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus for a substrate, comprising;
    a plurality of substrate processing units configured to process the substrate using a processing liquid;
    a processing liquid generating unit configured to dissolve a gas into a solvent to generate the processing liquid with a predetermined concentration, the processing liquid being supplied to one of the plurality of substrate processing units or being supplied to two or more of the plurality of substrate processing units simultaneously; and
    a control unit configured to control the plurality of substrate processing units and the processing liquid generating unit, wherein the processing liquid generating unit including: a solvent supply pipe connected to a solvent source to supply the solvent;
    a dissolving line configured to dissolve the gas into the solvent supplied from the solvent supply pipe;
    a bypass line connected in parallel to the dissolving line configured to allow the solvent to flow therethrough; and
    a resistance changing unit configured to change the flow resistance of the bypass line, wherein the control unit controls the resistance changing unit so that the ratio of the flow rate of the solvent flowing through the dissolving line to the flow rate of the solvent flowing through the bypass line becomes to be constant,
    wherein the resistance changing unit is constituted by connecting a plurality of bypass line constituting pipes in parallel, and
    wherein the control unit controls the resistance changing means so that the flow resistance of the bypass line is changed by changing the one or more bypass line constituting pipes for allowing the solvent to flow h, depending upon the flow rate of the generated processing liquid.

2. The liquid processing apparatus according to claim 1, wherein the flow resistance of each of the plurality of bypass line constituting pipes is different from each other.

3. The liquid processing apparatus according to claim 1, wherein at least one of the plurality of bypass line constituting pipes is provided with a flow regulator.

4. The liquid processing apparatus according to claim 1, wherein the resistance changing unit is a flow regulator provided in the bypass line.

5. The liquid processing apparatus according to claim 1, wherein the dissolving line is configured to dissolve the gas into the solvent so as to allow the processing liquid to be saturated.

* * * * *